(12) United States Patent
Feight

(10) Patent No.: US 8,274,394 B2
(45) Date of Patent: Sep. 25, 2012

(54) FAULTED CIRCUIT INDICATOR WITH END-OF-LIFE DISPLAY AND DISCHARGE

(75) Inventor: Laurence V. Feight, Island Lake, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 782 days.

(21) Appl. No.: 12/405,943

(22) Filed: Mar. 17, 2009

(65) Prior Publication Data

US 2009/0231150 A1  Sep. 17, 2009

Related U.S. Application Data

(60) Provisional application No. 61/037,249, filed on Mar. 17, 2008.

(51) Int. Cl.
*G08B 21/00* (2006.01)
*G01R 15/18* (2006.01)
*G01R 31/14* (2006.01)
*H02H 3/00* (2006.01)

(52) U.S. Cl. .............. 340/636.1; 340/664; 340/649; 340/657; 324/127; 324/509; 361/42

(58) Field of Classification Search ............... 340/636.1, 340/664; 324/127
See application file for complete search history.

(56) References Cited

U.S. PATENT DOCUMENTS

| | | | |
|---|---|---|---|
| 3,676,740 A | 7/1972 | Schweitzer | |
| 3,702,966 A | 11/1972 | Schweitzer | |
| 3,708,724 A | 1/1973 | Schweitzer | |
| 3,715,742 A | 2/1973 | Schweitzer | |
| 3,725,832 A | 4/1973 | Schweitzer | |
| 3,781,682 A | 12/1973 | Schweitzer | |
| 3,816,816 A | 6/1974 | Schweitzer | |
| 3,866,197 A | 2/1975 | Schweitzer | |
| 3,876,911 A | 4/1975 | Schweitzer | |
| 3,906,477 A | 9/1975 | Schweitzer | |
| 4,063,171 A | 12/1977 | Schweitzer | |
| 4,152,643 A | 5/1979 | Schweitzer | |
| 4,234,847 A | 11/1980 | Schweitzer | |
| 4,375,617 A | 3/1983 | Schweitzer | |
| 4,438,403 A | 3/1984 | Schweitzer | |
| 4,456,873 A | 6/1984 | Schweitzer | |
| 4,458,198 A | 7/1984 | Schweitzer | |
| 4,495,489 A | 1/1985 | Schweitzer | |
| 4,794,329 A | 12/1988 | Schweitzer | |
| 4,794,331 A | 12/1988 | Schweitzer | |
| 4,794,332 A | 12/1988 | Schweitzer | |
| 4,795,982 A | 1/1989 | Schweitzer | |
| 4,873,706 A | 10/1989 | Schweitzer | |
| 4,904,932 A | 2/1990 | Schweitzer | |
| 4,984,124 A | 1/1991 | Yeh | |

(Continued)

*Primary Examiner* — George Bugg
*Assistant Examiner* — Jack Wang
(74) *Attorney, Agent, or Firm* — Richard M. Edge

(57) ABSTRACT

A faulted circuit indicator (FCI) for providing an indication of a fault on a monitored conductor, determining whether the FCI is near the end of its useful life (or entered into an end-of-life mode) and altering an operation of the FCI if the useful life of the FCI has reached a select threshold. The operation alteration may include an alteration of the display and/or deactivation of certain features and/or functions of the FCI. Thus, the useful life of the FCI will be increased. Further, utility personnel will be more likely to notice that the FCI is in end-of-life mode. The FCI may also include a battery discharge module and a thyristor for discharging the battery for disposal upon decommissioning of the FCI.

25 Claims, 5 Drawing Sheets

U.S. PATENT DOCUMENTS

| | | |
|---|---|---|
| 5,008,651 A | 4/1991 | Schweitzer |
| 5,045,778 A | 9/1991 | Thibodeau |
| 5,070,301 A | 12/1991 | Schweitzer |
| 5,077,520 A | 12/1991 | Schweitzer |
| 5,095,265 A | 3/1992 | Schweitzer |
| 5,153,565 A | 10/1992 | Schweitzer |
| 5,168,414 A | 12/1992 | Horstmann |
| 5,180,972 A | 1/1993 | Schweitzer |
| 5,220,311 A | 6/1993 | Schweitzer |
| 5,274,324 A | 12/1993 | Schweitzer |
| 5,363,088 A | 11/1994 | Schweitzer |
| 5,406,195 A | 4/1995 | Schweitzer |
| 5,420,502 A | 5/1995 | Schweitzer |
| 5,550,476 A | 8/1996 | Lau |
| 5,565,783 A | 10/1996 | Lau |
| 5,656,931 A | 8/1997 | Lau |
| 5,677,623 A | 10/1997 | Schweitzer |
| 5,677,678 A | 10/1997 | Schweitzer |
| 5,729,125 A | 3/1998 | Schweitzer |
| 5,754,383 A | 5/1998 | Huppertz |
| 5,821,869 A | 10/1998 | Schweitzer |
| 5,889,399 A | 3/1999 | Schweitzer |
| 5,959,537 A | 9/1999 | Banting |
| 5,990,674 A | 11/1999 | Schweitzer |
| 6,002,260 A | 12/1999 | Lau |
| 6,014,301 A | 1/2000 | Schweitzer |
| 6,016,105 A | 1/2000 | Schweitzer |
| 6,043,433 A | 3/2000 | Schweitzer |
| 6,133,723 A | 10/2000 | Feight |
| 6,133,724 A | 10/2000 | Schweitzer |
| 6,211,764 B1 | 4/2001 | Schweitzer |
| 6,429,661 B1 | 8/2002 | Schweitzer |
| 6,433,698 B1 | 8/2002 | Schweitzer |
| 6,479,981 B2 * | 11/2002 | Schweitzer et al. .......... 324/133 |
| 6,734,662 B1 | 5/2004 | Fenske |
| 6,798,211 B1 | 9/2004 | Rockwall |
| 6,822,576 B1 | 11/2004 | Feight |
| 6,894,478 B1 * | 5/2005 | Fenske ......................... 324/127 |
| 6,949,921 B1 | 9/2005 | Feight |
| 6,963,197 B1 | 11/2005 | Feight |
| 7,023,691 B1 | 4/2006 | Feight |
| 7,053,601 B1 * | 5/2006 | Fenske et al. ................. 324/127 |
| 7,106,048 B1 * | 9/2006 | Feight et al. .................. 324/127 |
| 7,411,766 B1 * | 8/2008 | Huang et al. ..................... 361/42 |
| 7,586,718 B1 * | 9/2009 | Radosavljevic et al. ........ 361/42 |
| 2005/0212522 A1 * | 9/2005 | Finlay et al. ................. 324/509 |
| 2007/0086140 A1 * | 4/2007 | Swartzendruber et al. ... 361/115 |
| 2009/0091869 A1 * | 4/2009 | Huang et al. ..................... 361/42 |

* cited by examiner

FAULTED CIRCUIT INDICATOR WITH END-OF-LIFE DISPLAY AND DISCHARGE

CROSS-REFERENCE TO RELATED APPLICATIONS

The present patent application is a non-provisional application claiming the benefit under 35 U.S.C. §119(e) of U.S. Provisional Application Ser. No. 61/037,249, filed on Mar. 17, 2008 and entitled "Faulted Circuit Indication with End-of-Life Display and Discharge," naming Laurence V. Feight as inventor, the complete disclosure thereof being incorporated by reference.

TECHNICAL FIELD

This disclosure relates to faulted circuit indicators. More particularly, this disclosure relates to an end-of-life detection system and display for communicating that the faulted circuit indicator is approaching the end of its expected life. This disclosure also relates to a battery discharge system for the faulted circuit indicator once it has been removed from service.

BACKGROUND OF THE INVENTION

Various types of self-powered faulted circuit indicators ("FCIs") have been constructed for detecting electrical faults in power distribution systems, including clamp-on type faulted circuit indicators and test-point type FCIs. Clamp-on type FCIs clamp directly over cables in the systems and may derive their operating power from inductive and/or capacitive coupling to the monitored conductor. Test-point type FCIs are mounted over test-points on cables or associated connectors of the systems and may derive their operating power from capacitive coupling to the monitored conductor. Other prior art FCIs may be either of the manually resetting type, wherein it is necessary that the indicators be physically reset, or of the self-resetting type, wherein the indicators are reset upon restoration of line current.

Detection of fault currents in a monitored conductor by an FCI is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the FCI may be manually reset. In addition, some prior art FCIs have distinguished between the display of temporary faults and permanent faults. For example, the Schweitzer Engineering Laboratories Model AR-OH ("AutoRANGER") uses two downward facing red light-emitting diodes (LEDs) to indicate a permanent fault, and a single yellow LED to indicate a temporary fault.

Various prior art FCIs have utilized LEDs to display the presence of a permanent fault or that a temporary fault has occurred on the monitored conductor. For FCIs that are battery-powered, the lifetime of the FCI is a function of the number of faults, the characteristics of the fault display, and other various operating parameters specific to the type of FCI including the percent of time spent installed at different ambient temperatures. An expected lifetime of the FCI can be calculated using an estimation of the expected number of faults, the power use for displaying each fault, temperature, and the estimated background power usage.

The calculated lifetime of an FCI may be used in several ways to assist with ensuring that functioning FCIs are always installed on monitored conductors. In one example, the utility that manages the conductors and FCIs may simply replace all FCIs before the calculated lifetime of the FCI has lapsed. This technique has a disadvantage in that if the number of faults actually experienced was greater than expected, the FCIs may have stopped functioning due to a discharged battery before they were replaced. Further, if the number of faults actually experienced was less than expected, then the batteries in the FCIs would not be fully discharged when the FCIs are removed and disposed. It has been alleged that disposing of batteries with remaining charge is harmful to the environment, and may even be illegal.

Another method is for the FCI to be programmed to flash an indication that the battery life is nearing its end during the last six months of battery life. This method has several disadvantages. For example, in some cases the utility monitoring the conductor and associated FCIs will only survey the FCIs every three years. It would be unlikely, then, that the six-month display indicating an end of battery life would be noticed if the FCIs are only surveyed once every three years, and the FCIs with little or no useful life remaining would not be replaced. Further, it is most likely that the FCI will be noticed during or following a fault (when the FCI should be indicating that a fault is present). If the FCI displays only that the battery is nearing the end of its life, then it is not useful as a faulted circuit indicator. Alternatively, if the FCI displays only that a fault has occurred, then it is not useful to communicate that it is nearing the end of its life. In either case, the conductor is left unmonitored by FCIs. Further still, the indication while displaying low battery indication, quickly depletes battery capacity. Thus, the six-month display shortens the useful life of the FCI.

As is noted above, it is most likely that an FCI will be noticed by a utility when it is indicating the presence of a permanent or temporary fault on the conductor. That is, when utility personnel are using the FCIs to locate a fault on the conductor.

SUMMARY OF THE INVENTION

This disclosure relates to a faulted circuit indicator for providing an indication of a fault on a monitored conductor. The FCI generally includes an acquisition circuit in communication with the monitored conductor for receiving power system information from the monitored conductor. A processing circuit is further provided for receiving the power system information and determining whether a fault has occurred on the monitored conductor. The processing circuit further provides an indication to a display, which is powered by a battery. The display generally displays whether a fault has occurred and reflects whether the FCI has reached the end of its useful life. The useful life of the FCI is generally determined by an end-of-life module. In one embodiment, if the useful life of the FCI is below a select threshold, the end-of-life module alters at least one operation of the faulted circuit indicator and the display reflects the altering of the operation.

This disclosure also relates to a battery discharge module for an FCI and a thyristor in communication with the battery and the battery discharge module. The battery discharge module is generally configured to discharge the battery through the thyristor.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

FIGS. 1-7 generally illustrate a faulted circuit indicator for providing an indication of a fault on a monitored conductor. The FCI generally includes an acquisition circuit in communication with the monitored conductor for receiving power system information from the monitored conductor. A processing circuit is further provided for receiving the power system information and determining whether a fault has occurred on the monitored conductor. The processing circuit further provides an indication to a display, which is powered by a battery. The display generally displays whether a fault has occurred and reflects whether the FCI has reached the end of its useful life. The useful life of the FCI is generally determined by an end-of-life module. In one embodiment, if the useful life of the FCI is below a select threshold, the end-of-life module alters at least one operation of the faulted circuit indicator and the display reflects the altering of the operation.

Figure 2:
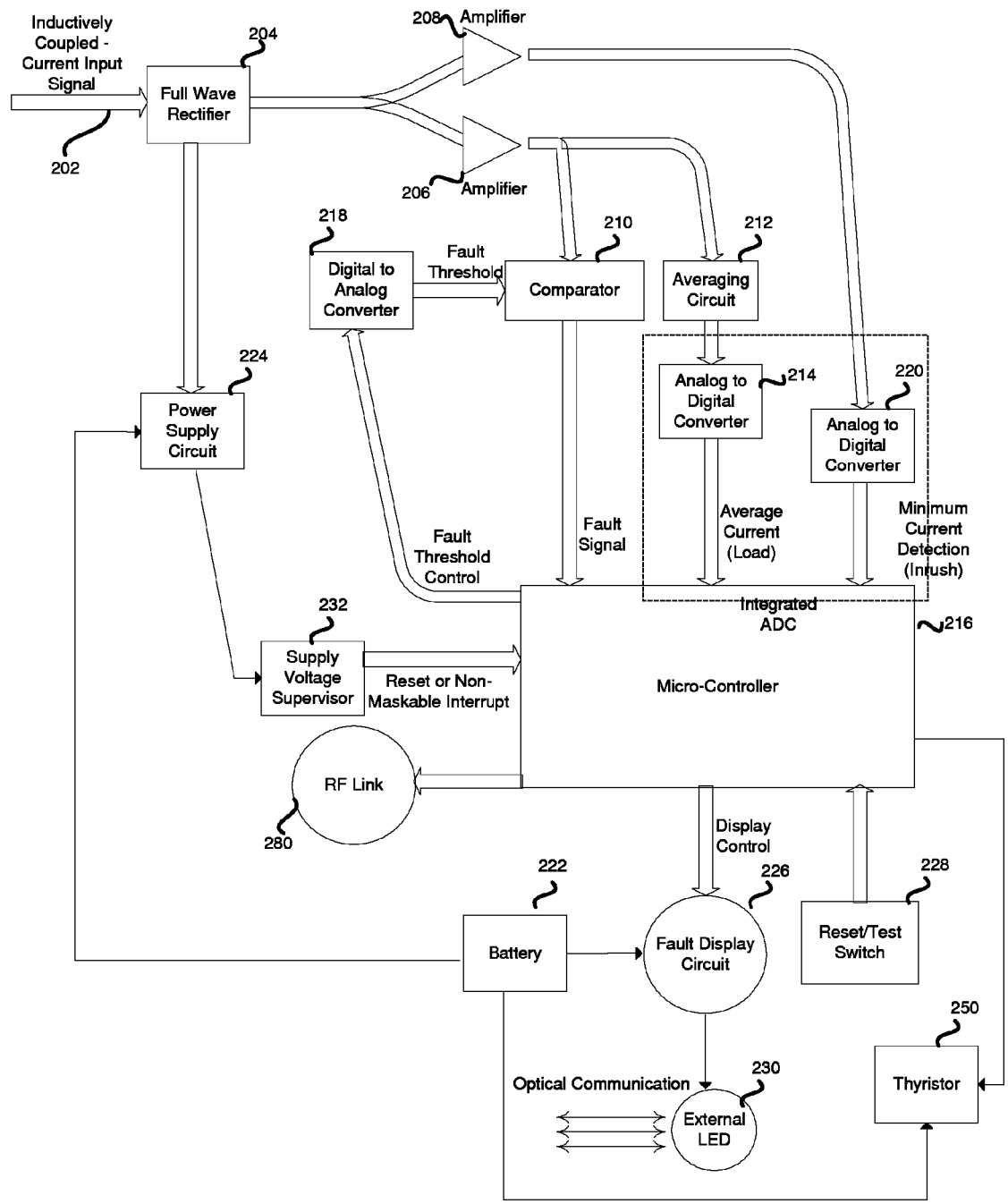
FIG. 2 is a block diagram of the current detection and monitoring circuitry of faulted circuit indicator that could be used with the invention.
Figure 3:
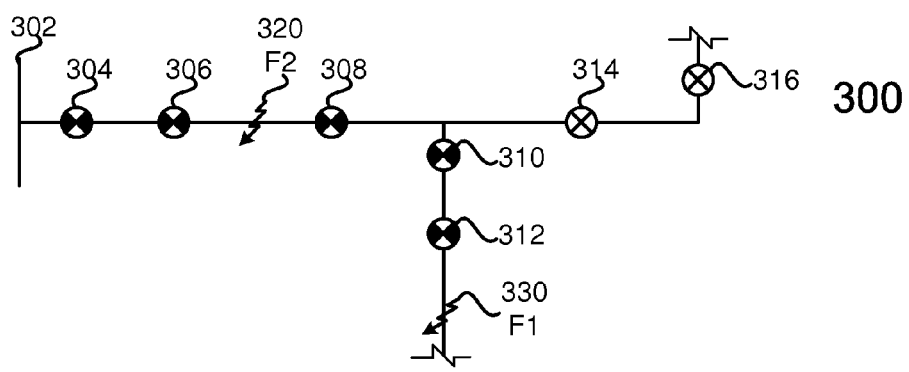
FIG. 3 is a one-line diagram illustrating the use of faulted circuit indicators as they could be used in conjunction with the present invention.

FIG. 2 also illustrates a battery discharge module on the processing circuit for an FCI and a thyristor in communication with the battery and the battery discharge module. The battery discharge module is generally configured to discharge the battery through the thyristor.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Figure 1:
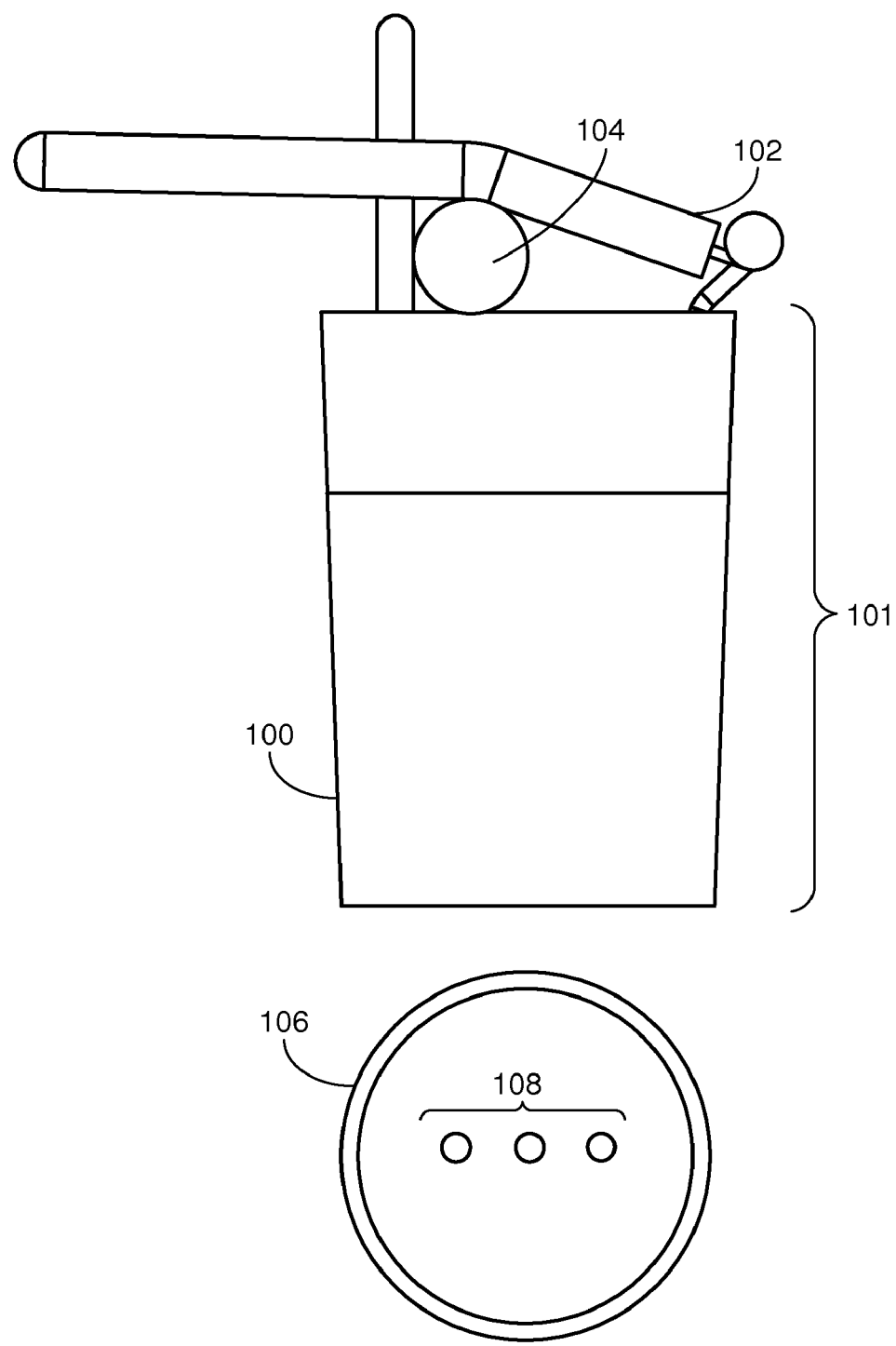
FIG. 1 is a side and bottom view of a faulted circuit indicator in accordance with the present invention.

FIG. 1 illustrates an overhead FCI 100 in accordance with the present invention. The FCI 100 of FIG. 1 includes a clamp 102 for mounting the FCI 100 to a monitored conductor 104. The FCI 100 includes a housing 101. The FCI 100 also includes a display 106 mounted within an end of the housing 101 such that utility personnel can visually see the display 106 when the FCI 100 is mounted to the conductor 104. The display includes a series of light indicators 108 such as incandescent bulbs, LEDs or the like. The housing 101, mounting clamp 102 and display 106 may be altered as needed for the particular installation. For example, if the FCI is to be mounted in an underground vault or enclosure, then the display may be remote and the mounting clamp may be altered as needed such that the FCI mounts to a test point or other available points. Further, the FCI may be mounted separate from the conductor and include a sensing means for gathering power signal information from the conductor.

FIG. 2 illustrates a block diagram of various modules of the FCI of FIG. 1. FIG. 2 illustrates the electronic circuitry, generally designated 200, for an FCI in block diagram form for monitoring a conductor. The FCI generally includes an acquisition circuit in communication with the monitored conductor for receiving power system information from the monitored conductor. As shown in FIG. 2, the FCI also generally includes a processing circuit for receiving the power system information, determining whether a fault has occurred and providing an indication thereof. For example, as shown in FIG. 2, acquired/monitored current 202 passes through a full wave rectifier 204, and into a pair of amplifiers 206 and 208. The output of amplifier 206 is routed to comparator 210, which generates a fault signal or indication in the manner described below. The output of amplifier 206 is also routed through an averaging circuit 212, and then into an analog to digital converter (ADC) 214 which may be an inherent accessory of the processor 216. Alternatively, averaging circuit 212 may not be present, and the processor 216 will then determine the instantaneous and average current using algorithms well known in the art. Based on the measured average current, the processor 216 will program a digital to analog converter (DAC) 218 to generate an input signal to the comparator 210.

The output from the amplifier 206 is tied to the negative input terminal of the comparator 210. The positive input terminal of the comparator 210 is sourced by the DAC 218 programmed by the processor 216. In this way, the processor 216 can control the comparator 210 threshold. Adjusting the comparator 210 threshold directly controls the fault current threshold.

The output of amplifier 208 is shown being passed through a second ADC 220. Note that a single ADC and a multi-position analog switch could be used as well. The processor 216 uses the data from this second ADC 220 to monitor the peak current detected by the current acquisition circuit once every half cycle period. If the monitored peak current is not sufficiently large, the processor 216 will record the time. The particular magnitude which the current must fall below before System Detect state is triggered is determined by the value of the monitored average current.

FIG. 2 also shows a battery 222, which provides power to the power supply circuit 224, processor 216, display control 226, or some subset thereof. The power supply circuit 224, which consists of one or more DC regulators and required support circuitry, provides regulated power to all circuits in the FCI. The power supply circuit 224 receives power from the battery 222 and/or unregulated power from the full wave rectifier 204.

Circuitry for a number of other functions common to faulted circuit indicators is also shown in FIG. 2. FIG. 2 shows a display controller 226 to control the display as described elsewhere herein. The processor 216 controls the display controller 226. For example, the display controller 226 may be adapted to effect an indication of a fault through a display means upon receipt of a signal or indication from the processor 216. FIG. 2 also shows a reset/test switch 228. The reset/test switch 228 allows maintenance personnel to manually reset the FCI and clear any faults, or, if no faults have been noted, to test the operation of the FCI and ensure that it can properly display the occurrence of any faults. In addition, FIG. 2 shows an external LED 230 coupled to the battery 222. This External LED 230 is adapted to display that a fault has occurred. Additionally, the LED may be configured to optically communicate with a computer or other device monitoring the FCI. Such communications could take place over fiber-optic lines.

In response to various circuit conditions, the processor 216 may provide a signal to activate the display control 226 to indicate that a fault has occurred. The processor 216 may optionally provide a SCADA output signal (not shown). If the FCI is of the targeted type the processor 216 may provide a signal to set the target to the fault indicating condition, or the processor 216 may provide a signal to reset the target to the normal condition after a timed reset interval, or the occurrence of some other condition, such as the monitored current falling below a predetermined or calculated value for a period of time. processor 216 may optionally process information for use on a seven-segment display, such as the amount of elapsed time since a fault occurred.

The FCI 200 may also optionally include a radio frequency (RF) link 280 in communication with the output of the processor 216. In this arrangement, the FCI is adapted to transmit status information to a data or communication system at a remote location via the RF link 280, such as a system for monitoring the electrical distribution system that employs a plurality of FCIs. For example, when the processor 216 provides a signal associated with a fault condition (as described herein), the RF link may be activated so as to communicate to a recipient that a fault alarm has been issued by a particular FCI. The processor 216 may be configured to format a message to be sent over the RF link 280 that includes particular information concerning the particular FCI (e.g. a serial number, GPS coordinates, or the like), and an indication as to the fault alarm. The message may include further information as to the monitored conductor and/or the particular FCI. The RF link 280 may be in communication with an existing communication network such as SCADA. The RF link 280 may be configured to interrogate the processor 216 for a message regardless as to whether the processor 216 has issued a fault alarm signal, and communicate the message back to the device that wishes to interrogate the FCI. The processor 216 may be further configured to create a message and communicate the message over the RF link 280 regardless of whether there is a fault alarm or interrogation. For example, the FCI may be configured to communicate the message after the passage of a predetermined amount of time.

The FCI may include memory for storing various modules. The memory may include the serial number and/or GPS coordinates of the transformer. The processor 216 may be configured to write to memory certain information such as samples taken, alarms issued, and the like for later investigation and/or communication.

The FCI may further include a module for detecting ambient temperature (not separately illustrated). The temperature may be determined using an element integral to the processor. The element may be a diode. One device that may be useful for monitoring ambient temperature is a thermocouple. The module for detecting ambient temperature may be in communication with the processor such that measurements of ambient temperature may be used in the various processes carried out by the processor. In one embodiment, battery usage for each event may be calculated differently depending on the measured ambient temperature. The module for detecting ambient temperature may also be useful in determining battery loss due to temperature based on manufacturer's curve of leakage as a function of temperature.

The processor may further be configured (via, for example, firmware, programming instructions saved on the memory, programming instructions active in the processor, or the like) to make calculations relating to the expected end of life of the FCI. In one example, the FCI may include an end-of-life module on the processing circuit for determining the useful life of the FCI. If the useful life of the FCI is below a select threshold, the end-of-life module may be adapted to alter at least one operation of the FCI (or entering into an "end-of-life mode") and the display may be adapted to reflect the altering of the operation.

In calculating the useful life of the FCI, the end-of life module may be adapted to calculate the remaining expected life of the FCI using programming instructions active in the processor 216. This may be done by subtracting a predetermined amount representative of energy used for a particular event from a starting amount representative of the energy available in the battery. This may be dependent on temperature, number of temporary and permanent faults detected, whether the unit indicates faults in daytime or nighttime modes, the flashing rate that is determined by the customer, and the like.

For example, it may be assumed that the battery has 8.5 ampere-hours of useful life. The processor may be configured to reduce this by 20% (to 6.8 ampere-hours) to account for battery anomalies and to be conservative. For each permanent fault, the processor may be configured to subtract a certain amount from the useful life. For each temporary fault, another certain amount would be subtracted. For each radio transmission, certain amounts would be subtracted for the type and/or length of the transmission. Likewise for each sample period. Also for each time that the FCI was asked to activate using the Reset/Test switch. Indeed, a certain amount may be assigned for each function that the FCI may perform, and that amount is subtracted each time that the FCI has performed that particular function. The resulting amount representing the remaining useful life may be stored in the memory.

In any embodiment, when the remaining useful life falls below a select threshold, the processor is configured to alter at least one operation of the FCI to lengthen the useful life of the FCI and/or to indicate to personnel that the remaining useful life of the FCI is low. For example, once 75% of the useful life of the FCI has been used (or 2.125 battery ampere-hours remain in the above example) the FCI may undertake these certain measures and enter an end-of-life mode. This may be accomplished by deactivating features, changing the display, and the like.

Figure 6:
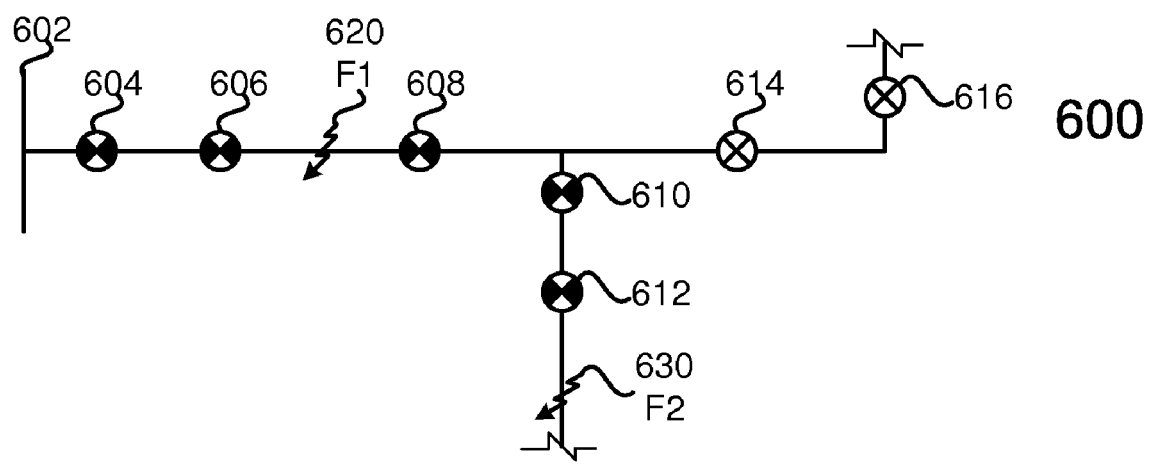
FIG. 6 is a one-line diagram illustrating the use of faulted circuit indicators as they could be used in conjunction with the present invention

In an embodiment, end-of-life may be determined by the time that the FCI has been installed and/or activated. This may be used in conjunction with the end-of-life calculation above in that the FCI would enter the end-of-life mode if either the time period lapses or a certain percentage (75%) of the useful life of the FCI has been used as determined above, or a combination of the two. One reason for this is that a utility may wish to install and change FCIs in groups and FCIs may not reach their end-of-life mode in groups. As can be seen in FIG. 6, several FCIs 604-616 are installed on a portion of an electrical distribution system 600. The electrical distribution system 600 includes a power source 602 such as a feeder or a bus. FCIs that are closer to the power source 602 would detect more faults than FCIs that are further from the power source because each FCI would detect each fault that occurred downstream from the FCI. For example, upon occurrence of fault F1 620, only FCIs 604 and 606 would detect the fault. Upon occurrence of fault F2 630, FCIs 604-612 would detect the fault. In none of these scenarios would FCIs 614 or 616 detect a fault. Thus, it would be expected that FCIs closer to the power source would detect more faults and diminish their useful life faster than FCIs installed further from the power source. To assist the utility in detecting that the group of FCIs are to be replaced, each of the FCIs 604-616 may include a clock, and the time between activation of the FCI and/or installation of the FCI on the line may be monitored. Once either a predetermined time has been reached or the useful life threshold has been reached, then the FCI would enter its end-of-life mode. The predetermined time may be calculated such that all of the group of FCIs may enter their end-of-life mode at relatively the same time. Utility personnel are then more likely to see that the FCIs need to be replaced, and the entire group of FCIs may then be replaced.

As is noted above, FCI may include an end-of-life module on the processing circuit for determining the useful life of the FCI. If the useful life of the FCI is below a select threshold, the end-of-life module may be adapted to initiate an end-of-life mode by altering at least one operation of the FCI. Certain functions and features of an FCI use up certain amounts of power. Once the useful life of the FCI falls below a select threshold, certain functions and features may be deactivated in the FCI, thus prolonging its useful life. Further, deactivating functions and features may be an indication to utilities that the FCI has entered the end-of-life mode.

One feature that may be deactivated is scheduled reporting via the RF link. If the FCI is configured to report via RF on a scheduled basis, it may cease this feature and only report when an event has occurred. In an embodiment, prior to deactivating this feature, the FCI may use the RF link to communicate that it has entered its end-of-life mode. The information that the FCI has entered its end-of-life mode may be routed to a utility system that logs items that need attention. RF reporting is a drain on the battery and thus reduces the useful life of the FCI. Thus by deactivating this feature, the FCI will lengthen its useful life.

Another feature or function that may be deactivated is the temporary fault display after a second fault is detected. This feature can be described in conjunction with FIG. 3, which illustrates a section of a power distribution system 300. As can be seen, the distribution system section 300 is monitored by several FCIs. When a fault occurs at location F1 330 each of the FCIs 304-312 would indicate that the fault has occurred using a particular display for a permanent fault. When the fault F1 330 clears, the FCIs 304-312 would change their display to indicate that a temporary fault has occurred. Then when a separate fault F2 320 occurs, FCIs 304 and 306 again indicate the presence of a permanent fault, while FCIs 308-312 continue to indicate a temporary fault. In accordance with the present invention, however, after permanent fault F2 320 occurs, if FCIs 308-312 are within the end-of-life mode, they would not indicate that a temporary fault has occurred, but would instead turn off their displays. This will conserve their useful life while still providing correct indication as to the location of the permanent fault F2 320.

As FCIs include a plethora of features several of which may be more necessary than others, the decision as to which to deactivate during end-of-life mode may be made and programmed into the FCI such that the FCI only operates the more necessary features after entering the end-of-life mode. This selection of features may be user defined and/or programmable into the FCI using the RF link, optical communication, reset/test switch, or the like.

As was mentioned above, an FCI may include an end-of-life module on the processing circuit for determining the useful life of the FCI. If the useful life of the FCI is below a select threshold, the end-of-life module may be adapted to initiate an end-of-life mode by altering at least one operation of the FCI. One of the drains on useful life of an FCI is the lighted display. Many FCIs use LEDs as the light display due to their nighttime visibility and relatively low energy consumption. The LEDs represent the largest power consumers in the Lithium cell power budget. The particular use of these LEDs may be modified once the FCI enters the end-of-life mode so as to both save energy and to indicate that the FCI has entered into its end-of-life mode.

FCIs are most likely to be monitored or seen by utility personnel upon the occurrence of a fault on a conductor. This is the time that the utility personnel will use the FCIs to determine the location of the fault, and so will be looking to the FCI display to determine whether the FCI detected the fault. Thus, if the display is altered, the utility personnel could use the FCI to determine location of the fault, and could notice that the FCI has entered the end-of-life mode, and the FCI would lengthen its useful life.

Figure 4:
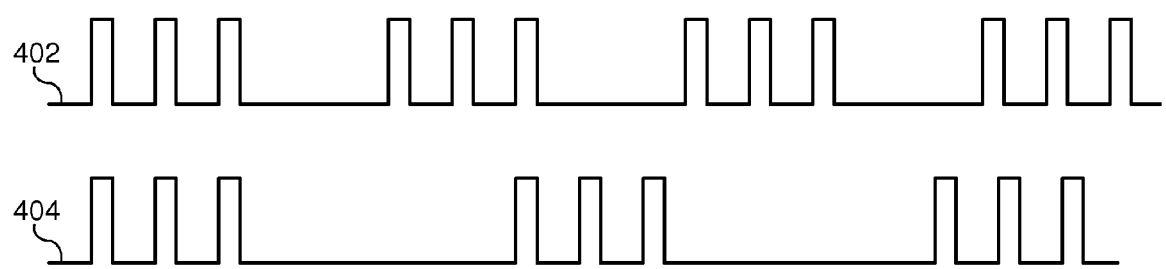
FIG. 4 is a timing diagram of a possible normal and end-of-life display.

One such modification of the display would be to increase a time between LED flashes. FIG. 4 illustrates a timing diagram of a flash pattern for a display (LEDs) of an FCI indicating a permanent fault. The top diagram illustrates a flash pattern 402 during typical operation of the FCI and the bottom diagram illustrates a flash pattern 404 during the end-of-life mode of the FCI. As can be seen, once the FCI enters end-of-life mode, there is a longer pause between the three-pulse sets. This saves energy (lengthening the useful life of the FCI) by not flashing the LEDs as often. This distinctive display pattern also indicates to utility personnel that the FCI is in its end-of-life mode.

If the utility personnel is not familiar with the LED flashing pattern, the personnel will at least notice that something is different with the particular FCI. In this case, the FCI may be interrogated to determine what the FCI needs (using the RF link, optical communication, and/or the reset/test switch), and the FCI may respond indicating that it has entered its end-of-life mode. Further, any time that the FCI is thus interrogated, the FCI can give an indication that it is within its end-of-life mode. As a result, utilities that survey each FCI once every three years, for example, will receive an indication that the surveyed FCIs are or are not within their end-of-life modes.

In an embodiment, the FCI will modify its display by lowering the intensity of the display once the FCI has entered the end-of-life mode. Some FCIs include a photo sensor and, under normal operation, intensify their display when there is above a certain threshold of ambient light (i.e. during the daylight hours) so that the display can be seen even when there are bright ambient conditions. Such FCIs may further lower the intensity of the display when there is less than a threshold of ambient light (i.e. the nighttime) to save battery life and because a lower intensity light is needed to notice the display during low-light conditions. In the present invention, the FCI may maintain a lower intensity display regardless of the ambient lighting conditions once the FCI enters end-of-life mode. Alternatively, the FCI may lower the intensity of both its daytime and its nighttime display modes so as to conserve its useful life. This embodiment also indicates to utility personnel that the FCI is within its end-of-life mode in that the personnel would notice that the light has diminished.

In an embodiment, the display is altered in that each pulse of the display is modified to include a series of smaller pulses such that the display appears to glimmer or twinkle during each pulse of the display.

In an embodiment, the number of LEDs used in the display may be decreased once the FCI enters the end-of-life mode. For example, for FCIs that use three LEDs to indicate an event, instead of flashing or engaging all three, two of the three may be used to indicate an event. Thus, the useful life of the FCI would be increased, and the modification in display also serves as an indication that the FCI has entered the end-of-life mode. The display pattern could also change from flashing to LEDs simultaneously to flashing single LEDs in a new pattern.

Figure 5:
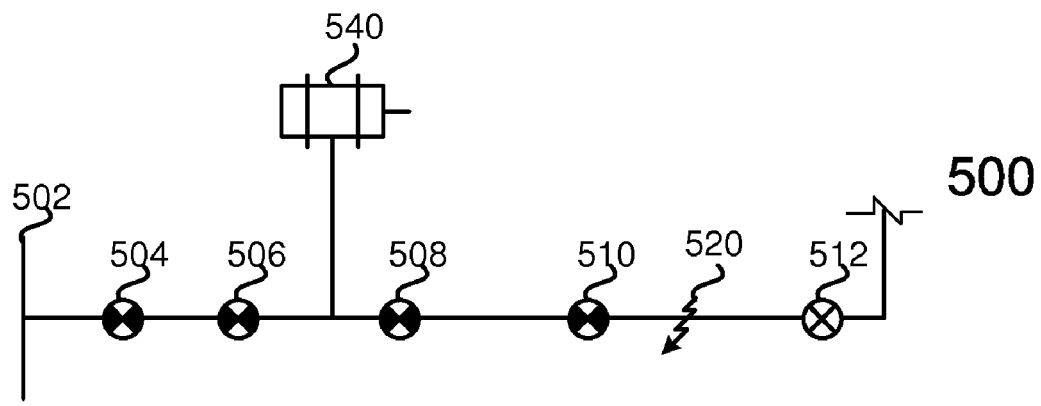
FIG. 5 is a one-line diagram illustrating the use of faulted circuit indicators as they could be used in conjunction with the present invention.

In an embodiment, the display may be modified only for particular event-types. For example, the display may be modified during a backfeed event. This is described in conjunction with FIG. 5. A one-line (single-phase) diagram of an electrical distribution system 500 is illustrated in FIG. 5, which is monitored by a plurality of FCIs 504-512. Power may be provided via a feeder 502 or other source. One branch of the system 500 includes a three-phase motor 540. A fault 520 occurs on the system 500. FCIs 504-510 indicate that a permanent fault has occurred. FCIs 508-510, however, also experience a backfeed from the three-phase motor 540 to the fault 520. After the fault 520 clears, FCIs 504 and 506 would indicate that the fault was temporary. FCIs 508 and 510, however, may indicate that there was a fault with a backfeed condition. If FCIs 508 and 510 are within their end-of-life mode, however, the backfeed display may be altered. For example, FCIs 508 and 510 may flash only two of their three LEDs in a "railroad" pattern instead of the typical display pattern. That is, if the three LEDs are disposed in a line (as illustrated in FIG. 1), the outermost LEDs may flash red in an alternating pattern. All FCIs continue to monitor the line for a permanent fault.

It is understood that multiple variations as to the display may be made to indicate that the FCI has entered end-of-life mode and/or conserve battery life (to increase the useful life of the FCI). Any modification or combination of modifications herein described are contemplated.

Figure 7:
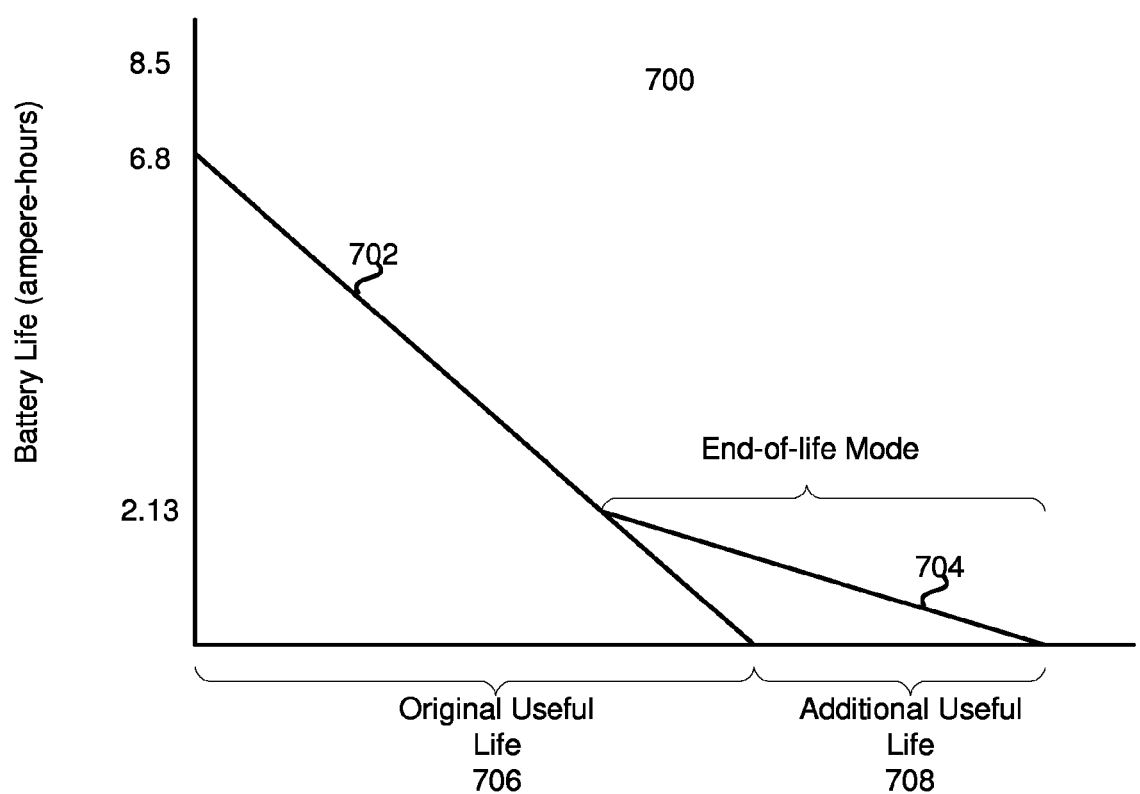
FIG. 7 is a graph representing the lengthening of life expected for a faulted circuit indicator employing the present invention.

The extension of useful life as a result of the present invention are illustrated in FIG. 7 which includes a plot 700 of available battery life (in ampere-hours) against time. As can be seen, a battery with a useful life of 8.5 ampere-hours is immediately devalued by 20% to 6.8 ampere-hours. If the FCI were to operate normally until the battery is completely discharged, the FCI would last for its Original Useful Life 706 (in "flashing hours", which can be calculated as indicated above by taking into account the number of operations that use power from the battery) as indicated by line 702. However, if the FCI were to enter the end-of-life mode as indicated by line 704, the useful life would be extended by the Additional Useful Life 708. It is contemplated that the end-of-life mode would be calculated such that the end-of-life mode would last for a predetermined amount of time (based on the expected number of events per year, background battery usage, and the like).

As was indicated above, disposal of batteries with charge remaining may pose an environmental, political, and/or legal problem. Disposal of a battery without charge, however, may not pose such problems. Because FCIs may be potted (i.e. filled with a compound that surrounds a substantial amount of the internal pieces including the battery), removal of a battery with remaining charge may be difficult or impossible. According to the present invention, a method and apparatus for discharging the battery without removal of the battery is provided. This feature is also beneficial for FCIs that use a replaceable cell. Utilities often opt to replace all cells in a group of like-FCIs at the same time. In such a case, not all of the cells in all of the FCIs may be completely discharged. Using the end-of-life discharge described herein, the utility may discharge the cell in each FCI before removal and disposal of the cell. This is accomplished by enabling a battery discharge module, waiting a predetermined amount of time (e.g. 10 minutes), removing the old cell, installing the new cell, and re-installing the FCI on the conductor.

In one embodiment as shown in FIG. 2, the FCI may generally include a processor 216 having a battery discharge module configured to receive a discharge command, and, in response, use or activate a thyristor 250 (e.g. silicon controlled rectifier (SCR)), thus allowing current to flow from the battery 222, and thus discharging the battery 222 for disposal.

The processor 216 may receive this command through the optical communication, RF signal 280, or the reset/test switch 228. In one embodiment, the reset/test switch 228 may be adapted to provide the discharge command. More specifically, the reset/test switch 228 may be in the form of a reed switch, which is configured to respond only to a unidirectional magnetic field such that it would not be triggered by magnetic fields of either the monitored conductor or nearby conductors carrying alternating current. In this embodiment, by holding a magnet tool near the reset/test switch 228 for a predetermined amount of time, the processor 216 is signaled to discharge the battery 222 via thyristor 250. In another embodiment, the FCI may include a dedicated reset button (not shown) that signals the processor discharge the battery.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A faulted circuit indicator for providing an indication of a fault on a monitored conductor, the faulted circuit indicator comprising:
    an acquisition circuit in communication with the monitored conductor for receiving power system information from the monitored conductor;
    a processing circuit for receiving the power system information, determining whether a fault has occurred and providing an indication thereof;
    a display for displaying that a fault has occurred upon receipt of the indication of a fault from the processing circuit;
    a battery for providing power to the display; and
    an end-of-life module operating on the processing circuit for determining whether the faulted circuit indicator operates within an end-of-life mode and altering an operation of the faulted circuit indicator when operating within the end-of-life mode, wherein the end-of-life mode is determined when the useful life of the battery is below a select threshold.

2. The faulted circuit indicator of claim 1, wherein the end-of-life module alters the operation of the display.

3. The faulted circuit indicator of claim 1, wherein the end-of-life module alters features of the faulted circuit indicator.

4. The faulted circuit indicator of claim 1, wherein the end-of-life module alters functions of the faulted circuit indicator.

5. The faulted circuit indicator of claim 2, wherein the end-of-life module increases a time between pulses of the display.

6. The faulted circuit indicator of claim 2, wherein the end-of-life module decreases intensity of the display.

7. The faulted circuit indicator of claim 2, wherein the display includes a plurality of light emitting diodes and the end-of-life module reduces a number of the plurality of light emitting diodes used to display a fault.

8. The faulted circuit indicator of claim 2, wherein the display includes a light emitting diode and the end-of-life module causes each flash of the light emitting diode to include a series of pulses.

9. The faulted circuit indicator of claim 2, wherein the display includes a plurality of light emitting diodes and the end-of-life module reduces a rate at which the light emitting diodes are flashed to indicate a fault.

10. The faulted circuit indicator of claim 3, wherein the end-of-life module alters a backfeed display feature of the faulted circuit indicator.

11. The faulted circuit indicator of claim 4 wherein the end-of-life module alters a radio-frequency communication function of the faulted circuit indicator.

12. The faulted circuit indicator of claim 1, further comprising a communications circuit in communication with the processing circuit and end-of-life module and configured to communicate that the faulted circuit indicator has entered an end-of-life mode.

13. The faulted circuit indicator of claim 1, further comprising a battery discharge module and a silicon controlled rectifier in communication with the battery and the battery discharge module, wherein the battery discharge module is configured to discharge the battery through the silicon controlled rectifier.

14. The faulted circuit indicator of claim 1, further comprising a memory module, wherein the memory module comprises an indication of the initial storage capacity of the battery and a second indication of the remaining storage capacity of the battery.

15. The faulted circuit indicator of claim 14, wherein the end-of-life module further comprises a battery tracking module in communication with the processor and the memory, wherein the battery tracking module is configured to recognize an operation of the display and cause the memory to update the second indication by reducing the second indication by a predetermined amount depending on the recognized operation of the display.

16. The faulted circuit indicator of claim 15, wherein the end-of-life module is configured to determine whether the faulted circuit indicator operates within an end-of-life mode depending on the second indication.

17. A faulted circuit indicator for providing an indication of a fault on a monitored conductor, the faulted circuit indicator comprising:
    an acquisition circuit in communication with the monitored conductor for receiving power system information from the monitored conductor;
    a processing circuit for receiving the power system information, determining whether a fault has occurred and providing an indication thereof;
    a display for displaying that a fault has occurred upon receipt of the indication of a fault from the processing circuit; and
    a battery for providing power to the display;
    a battery discharge module and a thyristor in communication with the battery and the battery discharge module, wherein the battery discharge module is configured to discharge the battery through the thyristor.

18. The faulted circuit indicator of claim 17, further comprising a reed switch in communication with the battery discharge module and configured to provide a discharge command to the battery discharge module upon detection of a unidirectional magnetic field for a predetermined length of time.

19. The faulted circuit indicator of claim 17, further comprising an end-of-life module operating on the processing circuit for determining whether the faulted circuit indicator operates within an end-of-life mode and altering an operation of the faulted circuit indicator when operating within the end-of-life mode.

20. The faulted circuit indicator of claim 17, wherein he thyristor is a silicon controlled rectifier.

21. A faulted circuit indicator for providing an indication of a fault on a monitored conductor, the faulted circuit indicator comprising:

an acquisition circuit in communication with the monitored conductor for receiving power system information from the monitored conductor;

a processing circuit for receiving the power system information, determining whether a fault has occurred and providing an indication thereof;

a display for displaying that a fault has occurred upon receipt of the indication of a fault from the processing circuit;

a battery for providing power to at least the display; and an end-of-life module operating on the processing circuit for determining the useful life of the faulted circuit indicator, wherein if the useful life of the battery is below a select threshold, said end-of-life module alters an operation of the faulted circuit indicator and said display reflects the altering of the operation.

22. The faulted circuit indicator of claim 21, wherein the end-of-life module alters the operation of the display if the useful life of the faulted circuit indicator is below a select threshold.

23. The faulted circuit indicator of claim 21, wherein the end-of-life module alters features of the faulted circuit indicator if the useful life of the faulted circuit indicator is below a select threshold.

24. The faulted circuit indicator of claim 21, wherein the end-of-life module alters functions of the faulted circuit indicator if the useful life of the faulted circuit indicator is below a select threshold.

25. The faulted circuit indicator of claim 21, wherein the useful life of the faulted circuit indicator is calculated using the battery life as a function of power dissipated or consumed due to exposure to an ambient temperature, detection of a fault or use of the display.

* * * * *